(12) United States Patent
Rubaldo et al.

(10) Patent No.: US 10,439,082 B2
(45) Date of Patent: Oct. 8, 2019

(54) PHOTODETECTOR WITH REDUCED DARK CURRENT

(71) Applicant: SOCIÉTÉ FRANÇAISE DE DÉTECTEURS INFRAROUGES—SOFRADIR, Palaiseau (FR)

(72) Inventors: Laurent Rubaldo, Fontaine (FR); Nicolas Pere Laperne, Grenoble (FR); Alexandre Kerlain, Grenoble (FR); Alexandru Nedelcu, Bourg la Reine (FR)

(73) Assignee: SOCIETE FRANCAISE DE DETECTEURS INFRAROUGES—SOFRADIR, Palaiseau (FR)

( * ) Notice: Subject to any disclaimer, the term of this patent is extended or adjusted under 35 U.S.C. 154(b) by 0 days.

(21) Appl. No.: 15/761,051

(22) PCT Filed: Sep. 15, 2016

(86) PCT No.: PCT/FR2016/052332
§ 371 (c)(1),
(2) Date: Mar. 16, 2018

(87) PCT Pub. No.: WO2017/046529
PCT Pub. Date: Mar. 23, 2017

(65) Prior Publication Data
US 2018/0277697 A1    Sep. 27, 2018

(30) Foreign Application Priority Data
Sep. 16, 2015   (FR) ...................... 15 58673

(51) Int. Cl.
H01L 31/0352   (2006.01)
H01L 31/101    (2006.01)
H01L 31/103    (2006.01)

(52) U.S. Cl.
CPC ............ H01L 31/035209 (2013.01); H01L 31/035236 (2013.01); H01L 31/101 (2013.01); H01L 31/1035 (2013.01)

(58) Field of Classification Search
CPC .............................................. H01L 31/035209
See application file for complete search history.

(56) References Cited

U.S. PATENT DOCUMENTS

| 7,687,871 B2 * | 3/2010 | Maimon ................ B82Y 20/00 257/189 |
| 8,004,012 B2 * | 8/2011 | Klipstein .............. H01L 31/101 257/196 |

(Continued)

FOREIGN PATENT DOCUMENTS

| EP | 2 802 018 A2 | 11/2014 |
| JP | 2012207968 A | 10/2012 |

OTHER PUBLICATIONS

Martyniuk et al., "Banier infrared detectors," Opto-Electronics Review, 2014, vol. 22, No. 2, pp. 127-146.

(Continued)

*Primary Examiner* — Eugene Lee
(74) *Attorney, Agent, or Firm* — Oliff PLC

(57) ABSTRACT

The photodetector includes a photon absorbing region formed by a first semiconductor material having a first bandgap energy value. It also includes a blocking region formed by at least second and third semiconductor materials configured to prevent the majority charge carriers from passing between the photon absorbing region and a contact region, the second semiconductor material presenting a second bandgap energy value higher than the first bandgap (Continued)

energy value to form a quantum well with the third semiconductor material. The blocking region is doped.

18 Claims, 2 Drawing Sheets

(56) References Cited

U.S. PATENT DOCUMENTS

| | | | | |
|---|---|---|---|---|
| 8,072,801 | B2* | 12/2011 | Velicu | B82Y 20/00 257/E31.015 |
| 8,450,773 | B1* | 5/2013 | Kim | H01L 31/1844 250/338.4 |
| 9,146,157 | B1* | 9/2015 | Rajavel | G01J 3/36 |
| 9,214,581 | B2* | 12/2015 | Khoshakhlagh | H01L 31/035236 |
| 2002/0027238 | A1* | 3/2002 | Lin | B82Y 20/00 257/292 |
| 2007/0215900 | A1 | 9/2007 | Maimon | |
| 2009/0256231 | A1 | 10/2009 | Klipstein | |
| 2010/0230720 | A1* | 9/2010 | Wicks | B82Y 20/00 257/188 |
| 2011/0037097 | A1* | 2/2011 | Scott | B82Y 20/00 257/184 |
| 2012/0145996 | A1 | 6/2012 | Ting et al. | |
| 2014/0225063 | A1* | 8/2014 | Klem | H01L 51/4213 257/14 |
| 2014/0264271 | A1* | 9/2014 | Shieh | C04B 38/0054 257/14 |
| 2014/0332755 | A1* | 11/2014 | Wei | H01L 31/035236 257/21 |

OTHER PUBLICATIONS

Ting et al., "Type-II superlattice barrier infrared detector," Infrared Remote Sensing and Instrumentation XIX, Proc. of SPIE vol. 8154, 2011, 81540L, pp. 1-12.

* cited by examiner

PHOTODETECTOR WITH REDUCED DARK CURRENT

BACKGROUND OF THE INVENTION

The invention relates to a photodetector comprising a photon absorbing region separated from a contact region by a blocking region of the photogenerated majority charge carriers.

STATE OF THE ART

In a wide variety of activities, a scene is observed by a detection device which comprises a photodetector. The photodetector receives a light signal which it transforms into an electric signal representative of the observed scene.

In conventional manner, the photodetector is a photodiode which comprises a p-n junction, i.e. it has an n-doped semiconducting region in contact with a p-doped semiconducting region.

The fact that these two semiconducting regions are in contact results in bending of the valence and conduction bands and in creation of a depletion region at the level of the metallurgical junction.

When a photon is absorbed, an electron and an electron hole are generated in the conduction and valence bands.

If a zero or reverse bias is applied to the terminals of the photodiode, the photogenerated charge carriers are collected and it is then possible to at least partially correlate the intensity of the measured current with the light flux received.

To observe a light flux of low intensity, it is particularly important to use photodiodes exhibiting very low noise levels and in particular minimising parasitic currents.

An alternative architecture is presented in the document US 2007/0215900 which presents a photodetector provided with an n-doped photon absorbing layer separated from a semiconducting contact region by a blocking layer exhibiting a much higher conduction band level than the conduction band level of the photon absorbing region so as to block the flow of majority charge carriers.

In conventional manner, in a photodiode, the parasitic current is also called dark current as it is measured when the photodiode is not subjected to any external light stimulation.

The dark current has at least two components which are a diffusion current and a "Generation-Recombination" current. The diffusion current corresponds to the thermal excitation of the electric charge carriers which can then flow between the valence and conduction bands. An efficient manner of reducing this noise component is to cool the photodiode.

Reducing the operating temperature also enables the second noise component to be reduced but in considerably less efficient manner. The second noise component corresponds to generation and recombination of the charge carriers from energy levels generally situated in the middle of the bandgap.

To reduce this second noise component, i.e. the "Generation-Recombination" noise, different teachings are available.

The document US 2009/0256231 describes the use of a device with a single doping type where two n-type layers with a narrow bandgap surround a third layer with a larger bandgap made from barrier material.

This document also describes a device with two different doping types, n-type and p-type, in which the photon absorbing region comprises a depletion-less region.

OBJECT OF THE INVENTION

The object of the invention is to provide a photodetector enabling the parasitic current and the electric consumption of the optronic system to be reduced.

This result tends to be achieved by means of a photodetector comprising:
a photon absorbing region formed by a first semiconductor material having a first bandgap energy value,
a contact region made from semiconductor material,
a blocking region formed by at least a second semiconductor material configured to oppose flow of the majority charge carriers between the photon absorbing region and the contact region, the second semiconductor material presenting a second bandgap energy value higher than the first bandgap energy value.

The photodetector is remarkable in that the blocking region is doped and configured to form at least one quantum well by means of the second semiconductor material and a third semiconductor material having a third bandgap energy value different from the second bandgap energy value.

In a particular embodiment, the blocking region comprises a fourth semiconductor material presenting a fourth bandgap energy value higher than the first bandgap energy value and different from the second bandgap energy value and from the third bandgap energy value.

It is also possible to provide for the photodetector to comprise a substrate comprising the photon absorbing region, the blocking region, the contact region and a support region, and for the support region to be separated from the contact region by the photon absorbing region and the blocking region.

In a particular case, the photodetector comprises:
an additional contact region and
an additional blocking region arranged between the photon absorbing region and the additional contact region, the additional blocking region being configured to block the minority charge carriers between the photon absorbing region and the additional contact region.

In an alternative embodiment, the additional contact region is arranged between the support region and the photon absorbing region.

It is further possible to provide for the additional blocking region to comprise at least one quantum well made from fifth and sixth semiconductor materials respectively presenting fifth and sixth bandgap energy values, the fifth and/or sixth bandgap energy value being higher than the first bandgap energy value.

In a particular embodiment, the first semiconductor material is the third semiconductor material and/or the fifth semiconductor material.

In preferential manner, the blocking region and/or the additional blocking region are doped over the whole of their thickness.

In a particular embodiment, the blocking region defines one or more potential well regions and several potential barrier regions and the blocking region is doped only in one or more of said potential well regions.

In an alternative embodiment, the blocking region defines one or more potential well regions and several potential barrier regions and the blocking region is doped only outside the potential well region or regions.

It is advantageous to provide for the blocking region to comprise an alternation of layers of second semiconductor material and of third semiconductor material and for the layers of second semiconductor material to be tensile stressed and the layers of third semiconductor material to be compressive stressed.

More particularly, the blocking region can comprise between 1 and 10 quantum wells.

In advantageous manner, the blocking region is in direct contact with the photon absorbing region. In preferential manner, the blocking region is in direct contact with the contact region.

BRIEF DESCRIPTION OF THE DRAWINGS

Other advantages and features will become more clearly apparent from the following description of particular embodiments of the invention given for non-restrictive example purposes only and represented in the accompanying drawings, in which.

DETAILED DESCRIPTION

Figure 1:
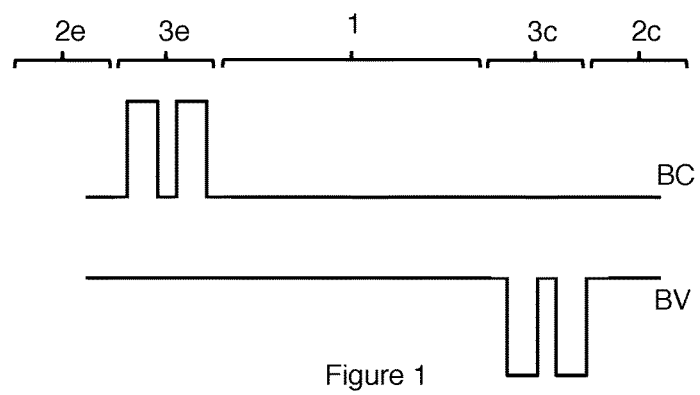
FIG. 1 represents a band diagram of a photodetector, in schematic manner.
Figure 11:
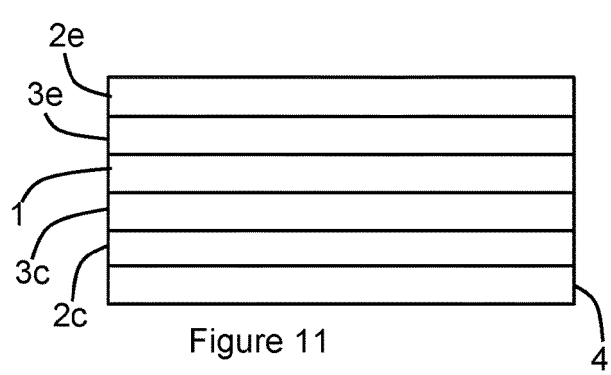
FIG. 11 represents a photodetector.

FIG. 1 illustrates a band diagram of a first embodiment of a photodetector shown in FIG. 11 formed on a substrate 4. The photodetector comprises a photon absorbing region 1 made from first semi-conductor material presenting a first bandgap energy value. The photon absorbing region 1 is configured to absorb a light radiation in a first wavelength range. Preferably the photon absorbing region 1 is configured to absorb and therefore to detect radiation in the infrared range. Depending on the configurations, all the bands of the infrared spectrum can be detected, but the device is particularly efficient in the 0.8 µm-30 µm range and more particularly in the 3 µm-5 µm range.

The photon absorbing region 1 is connected on one side to an emitter contact 2e and on the other side to a collector contact 2c. In other words, the emitter contact 2e and collector contact 2c are separated by the photon absorbing region 1. The contact regions 2e, 2c can advantageously be formed from one or more semiconductor materials. In preferential manner, the contact regions 2 are formed by doped semiconductor materials so as to reduce the contact resistances. Advantageously, the contact regions 2 are covered by a metal. The contact regions are used to bias the photodetector if necessary and to collect the charge carriers which have been generated.

In operation, electric charge carriers are generated in the photon absorbing region 1 when absorption of the light radiation to be detected takes place. The electric charge carriers are collected by the contact regions 2 to supply an electric current representative of the detected light radiation.

Between the photon absorbing region 1 and at least one of the contacts 2e, 2c, it is advantageous to provide a blocking region 3e, 3c which opposes flow of the majority charge carriers between the contact region 2 and the photon absorbing region 1. This blocking region 3e, 3c will reduce or even eliminate the dark current component linked to the electrically active defects in the structure and will therefore increase the signal-to-noise ratio of the photodetector. In operation, the photodetector also generates minority charge carriers and the minority carriers are measured to determine the detected light flux.

In other words, if the photon absorbing region 1 is primarily n-doped, it is advantageous to use a blocking region 3e for the electrons. It is advantageous to locate the electron blocking region 3e between the photon absorbing region 1 and the emitter contact 2e. On the other hand, if the photon absorbing region 1 is primarily p-doped, it is advantageous to use a blocking region 3c for the electron holes. It is advantageous to locate the electron hole blocking region 3c between the photon absorbing region 1 and the collector contact 2c. In preferential manner, the photon absorbing region 1 presents a dopant concentration situated in the $1*10^{14}$-$1*10^{17}$ atoms/cm$^3$ range.

In one embodiment, the blocking region 3e, 3c is in direct contact with the photon absorbing region 1 in order to gain in compactness. It is also possible to provide for the blocking region 3e, 3c to be in direct contact with contact 2e, 2c to gain in compactness. The material forming the blocking region 3e, 3c is not in direct contact with the metallic material which collects the electric charges. The metallic material is separated from the blocking region 3e, 3c by the contact 2c or 2e.

To block the charge carriers, the blocking region 3e, 3c comprises at least a second semiconductor material which presents a second bandgap value higher than the first bandgap value of the photon absorbing region 1. Preferably, the bandgap of the blocking region 3e, 3c is at least twice as great as the bandgap of the photon absorbing region 1, i.e. of the first semiconductor material. The second semiconductor material is also called barrier material.

To block the electrons, the band offset takes place primarily in the conduction band. To block the electron holes, the band offset takes place primarily in the valence band.

In advantageous manner, the minimum energy difference between the bands associated with the majority carriers in the photon absorbing region 1 and in the blocking region is greater than or equal to 3 kT to form an efficient blocking region, where k corresponds to the Boltzmann constant and T corresponds to the temperature of the photodetector in Kelvins.

For an electron blocking region 3e, 3c, the second semiconductor material presents a conduction band level that is higher than the conduction band level of the first semiconductor material forming the photon absorbing region 1. For an electron hole blocking region, the second semiconductor material presents a valence band level which is lower than the valence band level of the first semiconductor material forming the photon absorbing region 1.

In advantageous manner, to avoid blocking a part of the minority carriers, it is advantageous to choose a barrier material that does not present any band offset with the material of the photon absorbing region 1 on the other band, i.e. the band linked to the minority carriers.

For a primarily n-doped photon absorbing region 1, a zero or quasi-zero band offset is desirable for the valence band BV. For a primarily p-doped photon absorbing region 1, a zero or quasi-zero band offset is desirable for the conduction band BC. It is advantageous to consider that an energy difference less than or equal to 200 meV and/or less than or equal to 3 kT is considered as being a quasi-zero offset, k corresponding to the Boltzmann constant and T to the temperature of the photodetector in Kelvins.

In the case where the photon absorbing region 1 is formed by a superlattice, it is advantageous to consider that the bandgap energy of the photon absorbing region 1 corresponds to the value of the smallest energy difference existing between the hole mini-bands and the electron mini-bands.

In a particularly advantageous embodiment, the blocking region 3e, 3c is configured to form at least one quantum well. The blocking region 3e, 3c comprises at least the second semiconductor material and a third semiconductor material. The third semiconductor material presents a third bandgap energy value that is different from the second bandgap energy value.

The quantum well is different from the superlattice. In a superlattice, it is necessary to form several different layers with a periodicity between these different layers. Furthermore, the superlattice is only obtained by using a very large number of repetitions of the different layers.

In advantageous manner, the blocking region 3e, 3c is configured in such a way that the charge carrier wave functions in the well materials are not coupled to one another. The charge carrier wave functions remain localised in the real space of the well material. In advantageous manner, the blocking region 3e, 3c is devoid of mini-bands. However, quantified and localised states can be formed in the well material. In the case of quantum wells, the barrier materials have larger thicknesses than the thicknesses of the well materials, preferably at least more than twice the thickness of the well material, even more preferentially at least more than three times the thickness of the well material.

In a superlattice, the carrier wave functions of the different well materials are on the contrary coupled to one another. For this, the barrier and well materials generally have similar thicknesses. As a result, the wave functions are delocalised in the real space and mini-bands appear. It is apparent that such an architecture with a superlattice is detrimental to satisfactory operation of the detector.

In advantageous manner, the blocking region contains less than 10 well regions, i.e. less than 10 regions made from well material are separated by a region made from barrier material. In an advantageous embodiment, the blocking region contains less than 7 well regions and preferentially between 5 and 7 well regions. As an alternative, it is possible to provide a blocking region containing less than 5 well regions.

In an advantageous embodiment, the blocking region is aperiodic, i.e. it is does not have any periodicity in repetition of a couple formed by a barrier material and a well material. When the blocking region has several well regions, the lack of periodicity can be obtained by using different thicknesses between the different well regions, the barrier material thickness being constant between two consecutive well regions. As an alternative, when the blocking region has several well regions, the lack of periodicity can be obtained using different thicknesses between the different barrier regions, the thickness of well material being constant between two consecutive barrier regions. It is further possible to combine these teachings to vary the thickness of the well region and the thickness of the barrier region.

In another embodiment which can be combined with the foregoing embodiments, it is possible to modify the material forming the barrier region and/or the well region between two successive barrier regions and two successive well regions.

In advantageous manner, to efficiently block the charge carriers, the ends of the blocking region 3e, 3c are formed by the second semiconductor material and possibly a fourth semiconductor material exhibiting a higher bandgap value than the first bandgap value of the photon absorbing region 1. As previously, the material forming the apex of the blocking region 3e, 3c presents a bandgap energy which is equal to at least twice the bandgap energy of the material forming the photon absorbing region 1. The semiconductor material forming the potential well region can be identical to the first semiconductor material forming the photon absorbing region 1.

The ends of the electron blocking region 3e, 3c are each formed by a material having a higher conduction band level than that of the photon absorbing region 1 (of n type).

To engineer the hole blocking region 3e, 3c, what was explained for the electron barrier is again true in absolute values. For the hole blocking region, the fourth semiconductor material presents a valence band energy level which is lower than that of the first semiconductor material of the photon absorbing region 1. The fourth semiconductor material advantageously presents a valence band level which is lower than the valence band level of the third semiconductor material. There again, a minimum energy difference greater than or equal to 3 kT between the valence bands is particularly advantageous to form an efficient barrier. What was explained previously for the energy difference with respect to the contact can also be applied in this case.

The ends of the hole blocking region 3e, 3c are each formed by a material having a valence band level lower than that of the photon absorbing region 1 and lower than the valence band level of the third semiconductor material. The ends of the blocking region 3e, 3c can be formed by the second semiconductor material or by the fourth semiconductor material. The third semiconductor material can be identical to the first semiconductor material forming the photon absorbing region 1.

As a variant, it is possible to provide for the well region to be formed or partially formed by a semiconductor material exhibiting a smaller bandgap than the bandgap of the photon absorbing region 1. It is possible to provide for the well region to be formed or partially formed by a semiconductor material exhibiting a larger bandgap than the bandgap of the photon absorbing region 1.

The use of a blocking region 3e, 3c formed by means of quantum well enables the parasite barriers of the photodetector to be reduced or even eliminated, which enables the voltage applied to make the photodetector operate to be reduced thereby increasing the quality of the formed image.

Depending on the embodiments, the third semiconductor material presents a third bandgap energy value that is lower or higher than the second bandgap energy value so as to form at least one quantum well. A quantum well is a region of space in which the potential perceived by a quantum particle reaches a minimum. The quantum well represents a potential well with dimensions causes in a difference between the predictions of quantum mechanics and those of conventional mechanics.

The blocking regions 3e, 3c preferentially use materials with different bandgap energies to form discontinuities in the conduction band BC and/or in the valence band BV.

The blocking region 3e, 3c is formed by at least one well material which defines the potential well and at least one barrier material which defines the potential barrier. Depending on the embodiments, the second semiconductor material is a well or a barrier material.

If several quantum wells are formed, there is preferably an alternation between the materials forming the well regions and the materials forming the barriers or apexes of the blocking region 3e, 3c. This configuration enables one or more quantum well is to be easily formed in the blocking region 3e, 3c.

To form a quantum well, the thickness of the potential well is close to the wavelength value of the particle. To form a quantum well, it is advantageous to provide for the thickness of the potential well, for example the thickness of the third semiconductor material, to be about a few nanometers, preferably between 3 Å and 200 Å and even more preferentially between 3 and 10 nanometers.

In like manner, to form a very efficient blocking region, it is also advantageous to provide for the thickness of the material or materials forming the blocking region $3e$, $3c$, i.e. the total thickness of the blocking region $3e$, $3c$, to be comprised between 50 Å and 5000 Å.

In a particular embodiment, the third semiconductor material is surrounded by materials having a higher bandgap energy value. The third semiconductor material defines a potential well region and can also be called well material.

The well regions are formed by materials which have smaller bandgap than the bandgap of the barriers. Depending on the embodiments, the bandgap of the quantum well can be smaller than, identical to or greater than the bandgap of the photon absorbing region 1.

It is particularly advantageous to provide for the quantum wells to be defined in one dimension only, i.e. in the direction of growth of the different layers of the device, in other words the direction connecting the emitter to the connector.

In a preferential embodiment, the level of the quantified state in the quantum well is offset from the level of the energy band associated with the majority carriers, i.e. from the level of the conduction band BC of the contact (for an n-type photon absorbing region) and/or from the level of the valence band BV of the contact (for a p-type photon absorbing region). This precaution enables transport phenomena of the charge carriers by tunnel effect to be greatly reduced or even suppressed.

To almost completely eliminate transport by tunnel effect, it is advantageous to have an energy offset with a value greater than or equal to $1*kT$ where k corresponds to the Boltzmann constant and T to the temperature of the photodetector in Kelvins.

In a privileged embodiment, the photodetector is formed in the substrate which comprises the photon absorbing region 1, the blocking region $3e$, $3c$, the contact region 2 and a support region. The support region is separated from the contact region 2 by the photon absorbing region 1 and the blocking region $3e$, $3c$. The support region can be an initial substrate on which the different layers of the photodetector are deposited. Depending on the embodiments, the support layer either performs an electrical role or not.

In a preferential embodiment, two blocking regions $3e$, $3c$ are used. The two blocking regions $3e$, $3c$ are separated by the photon absorbing region 1. The blocking region $3e$, $3c$ is associated with an additional blocking region which is configured to block the minority carriers between the photon absorbing region 1 and the additional contact region. The additional blocking region lies between the photon absorbing region 1 and the additional contact region.

There is then a first blocking region arranged between the photon absorbing region 1 and a readout circuit and a second blocking region arranged between the photon absorbing region 1 and the support layer. The support layer provides the mechanical strength of the photodetector layers.

The use of a blocking region $3e$, $3c$ arranged on the support layer side enables the parasitic currents resulting from recombination of the charge carriers at the substrate/epitaxied region interface to be reduced and preferably suppressed. For example purposes, the collector contact $2c$ can be the substrate or an intermediate layer between the substrate and the blocking region $3e$, $3c$. The substrate or part of the substrate acts as support layer. The epitaxied region corresponds to the region formed by one or more layers deposited by epitaxy on the substrate. The layers formed on the substrate are for example the additional blocking region, the photon absorbing region, the blocking region, the contact region, and the additional contact region if applicable.

The additional blocking region is advantageously formed by fifth and sixth semiconductor materials which are configured to define one or more quantum wells. The additional blocking region comprises at least one quantum well made from fifth and sixth semiconductor materials respectively exhibiting fifth and sixth bandgap energy values. The fifth and/or sixth bandgap energy value is higher than the first bandgap energy value.

The photon absorbing region 1 is then separated from the emitter contact $2e$ and collector contact $2c$ by blocking regions $3e$, $3c$ which are both configured to oppose flow of the charge carriers. There are then two blocking regions $3e$, $3c$ separated by the photon absorbing region 1. One of the blocking regions opposes passage of the electrons whereas the other blocking region opposes passage of the holes.

Whether the photon absorbing region 1 be n-doped or p-doped, it is advantageous to provide for the blocking region $3e$, $3c$ located near the contact with the readout circuit to be configured to block the majority carriers. The blocking region $3e$, $3c$ located on the support layer side is preferentially configured to block the minority carriers. Placing the blocking region $3e$, $3c$ of the majority carriers on the side where the contact with the readout circuit is located results in simpler operation of the photodetector.

If the photodetector comprises two blocking regions respectively located on the emitter side and the collector side, it is particularly advantageous to provide for the use of different barrier materials. The additional blocking region is for example formed with an additional barrier material. The same can be the case for the well material which is then an additional well material. However, it is also possible to provide for the additional well material to be identical to the well material of the blocking region, for example the third semiconductor material.

In an advantageous embodiment, what was explained for the blocking region can also be applied for the additional blocking region in relation with the other charge carriers.

If the photon absorbing region is n-type, for an electron blocking region, it is advantageous to provide for the valence band level to be identical or almost identical between the photon absorbing region 1, the electron blocking region $3e$ and contact $2e$. For a hole blocking region, it is advantageous to provide for the conduction band level to be identical or almost identical between the photon absorbing region 1, the hole blocking region and contact $2c$. Depending on the type of doping of the photon absorbing region 1, the hole blocking region $3c$ acts as blocking region of the majority or minority carriers. The same is the case for the electron blocking region.

Different embodiments are illustrated in FIGS. 2 to 5. Depending on the embodiments, the potentials are modified in symmetrical or non-symmetrical manner with respect to a plane located in the centre of the blocking region $3e$, $3c$ (in the direction of the thickness). The blocking region $3e$, $3c$ then comprises different materials to form the different barrier regions or the same materials to form barriers with variable compositions.

Figure 5:

In one embodiment, one or more of the barriers can present a composition gradient. In an even more particular embodiment, the composition gradient defines a parabolic outline on the conduction band BC or on the valence band BV of the barrier. In advantageous manner, a parabolic outline can be obtained by means of an alloy of $Al_xGa_{1-x}Sb$ type the composition of which varies between $Al_{0.1}Ga_{0.9}Sb$ and $Al_{0.42}Ga_{0.58}Sb$ to form for example an outline as depicted in FIG. 5.

In a particularly advantageous embodiment, a barrier region is formed by several different semiconductor materials so that the apex region exhibits a modification of its conduction band level over its thickness, in the case of an electron barrier. In the case of a hole barrier, several materials can be used so that the apex region presents a modification of the valence band level.

Figure 2:
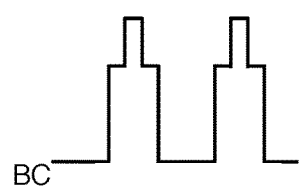
FIGS. 2 to 5 represent an electron barrier region, in schematic manner.
Figure 2:

In the embodiment illustrated in FIG. 2, the two barrier regions are formed by at least two materials having different bandgap energies so that the material having the higher bandgap energy is surrounded by another apex material having a lower bandgap energy. In one embodiment, the apex material having the larger bandgap is placed in the centre of the apex region so as to respect a symmetry in the potentials. As a variant, the apex of the barrier region can be located in any position. It is also possible to provide for the material having the higher bandgap energy not to be surrounded on each side by another apex material having a smaller bandgap width.

Figure 3:
Figure 3:

In the embodiment of FIG. 3, the material defining the potential well exhibits a smaller bandgap than that of the material of the photon absorbing region 1. As a variant that is not represented, the material defining the potential well exhibits a larger bandgap than that of the material of the photon absorbing region 1.

Figure 4:
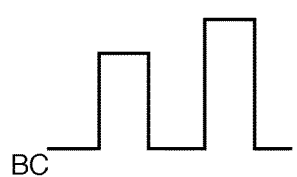
Figure 4:

In the embodiment of FIG. 4, the two apex areas which surround the quantum well are formed by two different materials which present different bandgap values. The blocking region 3e, 3c does not present a symmetrical modification of the potentials with respect to the centre of the blocking region 3e, 3c.

In the embodiment of FIG. 5, the two apex areas which surround the quantum well are formed by several materials so that the conduction band energy value is modified gradually as the distance from the potential well region increases. It is possible to use alloys for which the composition and/or doping are modified spatially.

The different embodiments presented in the foregoing can be combined with one another. For example it is possible to provide an apex region according to the embodiment of FIG. 2 and another apex region according to the embodiment of FIG. 5. It is also possible to use more than two barrier materials to form a barrier and/or more than two well materials to form a quantum well.

The different embodiments illustrate the electron blocking regions with adjustment of the conduction band level. It is naturally possible to achieve the same structures by adjusting the valence band level to form electron hole blocking regions.

Figure 6:
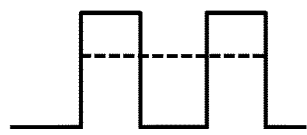
FIGS. 6 to 10 represent different dopings able to be performed for an electron barrier illustrated in FIG. 1, in schematic manner.
Figure 7:
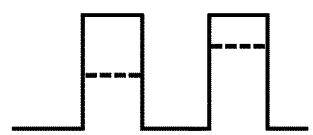

To make the blocking region 3e, 3c more efficient, it is particularly advantageous to dope the blocking region to block electrons and/or holes. The blocking region 3e, 3c can be doped over the whole of its thickness or over a part of its thickness only. FIG. 6 illustrates doping of the blocking region 3e, 3c over the whole of its thickness. The dopant concentration and the distribution of the dopants in the different layers of the blocking region 3e, 3c are represented in very schematic manner. FIG. 6 thus combines a representation of the valence and conduction band energies and a representation of the spatial distribution of the dopants over the thickness of the photodetector. FIGS. 6 to 9 do not represent the Fermi levels or the energy confinement levels in the quantum well materials.

Doping of the blocking region 3e, 3c enables the charge carriers to be transferred to the interface between the blocking region 3e, 3c and the photon absorbing region 1 thereby enabling the depletion region to be reduced. Doping of the blocking region 3e, 3c enables the volume of the depletion region in the photon absorbing region 1 to be reduced and preferentially makes it possible not to have any depletion region in the photon absorbing region 1.

The use of a doped blocking region 3e, 3c with at least one quantum well makes it possible to achieve a better control of the effective doping level and a better control of the distribution of the charge carriers at the operating point of the photodetector. More particularly, such a structure makes management of the constraints inherent in crystal growth techniques easier to perform, for example growth by molecular beam epitaxy or growth by metalorganic vapour phase epitaxy, for which an influence of the residual impurities level on the effective doping of the materials forming the blocking region 3e, 3c may exist.

This configuration enables the charge carrier density to be better controlled by adjusting the thickness and position of the doped region within the blocking region 3e, 3c. The photodetector is less sensitive than devices of the prior art to the growth conditions and to the uncertainties of fabrication induced by contingencies of the actual growth conditions.

In a particular case, one of the apexes of the blocking region 3e, 3c is doped over the whole of its thickness. As a variant, several apexes are doped over the whole of their thickness. In a last embodiment case illustrated in FIG. 7, each apex is doped over the whole of its thickness. In the particular embodiment illustrated, two different doping levels are represented on the two apexes of the blocking region 3e, 3c. Identical dopings are also possible.

Figure 8:
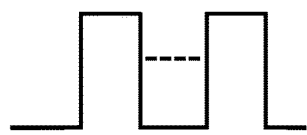

It is also possible to provide for a well to be doped over the whole of its thickness or for several wells to be doped over the whole of their thickness. As an alternative, it is possible to fabricate a photodetector where only all the well materials are doped over the whole of their thickness. FIG. 8 illustrates doping of the well of the blocking region 3e, 3c.

As a variant to what has been indicated in the foregoing, it is possible to replace complete doping of the thickness of a well or of an apex by doping on only a part of the thickness of the well or of the apex.

Figure 9:
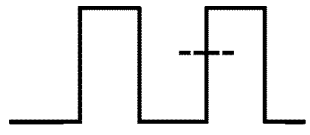

It is also possible to provide for the doped region to cover a part of the well and a part of an apex as illustrated in FIG. 9.

Figure 10:
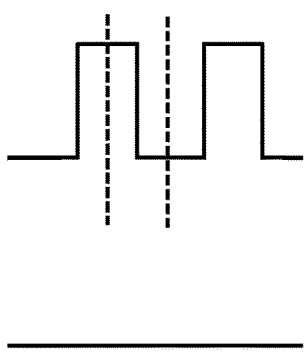

In an embodiment that is able to be combined with what was described in the foregoing, doping is performed on a region of small thickness, for example over a thickness of less than 10 nm. In a particular case, doping is performed on one or more atomic planes, for example less than 5 atomic planes, to obtain a structure called Delta Doping or δ-Doping structure. The embodiment illustrated in FIG. 10 depicts the use of two doping planes. A first doping plane is made in the barrier whereas the second doping plane is made in the potential well. There again, this embodiment can be combined with what was described in the foregoing.

For example, the doping is performed at one of the ends of the blocking region either in the barrier material in contact with the emitter of collector contact or in the barrier material in contact with the photon absorbing region 1.

In an alternative embodiment, several different doped regions can be achieved in a well region and/or in an apex region. It is naturally possible to fabricate different doped regions with different doping levels. It is furthermore possible to combine the different embodiments indicated above.

The different embodiments indicated in the foregoing can naturally be combined, doping of the whole thickness of the blocking region is not incompatible with the use of a doping plane. Different doping levels are also able to be used. The embodiments illustrated in FIGS. 6 and 9 represent a blocking region 3e, 3c illustrated in FIG. 1. It is naturally possible to combine the different doping modes indicated with any one of the blocking regions indicated in the foregoing and/or illustrated in FIGS. 1 to 5. The same can be applicable for a hole blocking region.

In preferential manner, the number of wells in the blocking region 3e, 3c is less than or equal to 10 so as to have a notable effect on the parasitic currents without resulting in a greatly increased complexity of the structure of the photodetector.

If several doped regions are made in a blocking region 3e, 3c, it is possible to vary the doping levels between the doped regions. If the whole blocking region 3e, 3c is doped, it is possible to have a constant doping level over the whole of the blocking region 3e, 3c or to have variations over the thickness of the blocking region 3e, 3c.

In one embodiment, the blocking regions 3e, 3c are formed by stacks of materials which exhibit different lattice parameters. In this exemplary case, it is particularly advantageous to choose the different materials forming the blocking region 3e, 3c so that at least a partial compensation of the stresses between the layers forming the blocking region 3e, 3c exists with respect to the semiconductor substrate supporting the absorbing region and/or the support layer.

In one embodiment, the semiconductor layers forming the potential well are tensile or compressive stressed and the semiconductor layers forming the apexes are respectively compressive or tensile stressed to at least partially compensate the stresses of the wells. It is then possible to fabricate blocking regions 3e, 3c having large thicknesses without the risk of damaging the crystallographic quality on account of the stress relaxation phenomena.

In a simplified embodiment, the second semiconductor material is tensile stressed and the third semiconductor material is compressive stressed. As a variant, the second semiconductor material is compressive stressed and the third semiconductor material is tensile stressed.

In a particular embodiment, the photon absorbing region 1 is made from a material of III-V or II-VI type, for example from $Hg_{1-x}Cd_xTe$ and advantageously from an InAsSb alloy, to detect a radiation having a wavelength comprised between 1 µm and 5.8µm. As a variant, the material of the photon absorbing region 1 can be chosen from InAs or InGaAs, or from $InAs/In_{1-x}Ga_xSb$ or $InAs/In_{1-x}As_xSb$ superlattices. As indicated in the foregoing, the material of the photon absorbing region 1 can be primarily n-doped or p-doped. The photon absorbing region 1 can also be unintentionally doped. In more particular manner, the material of the photon absorbing region 1 can be chosen from $Ga_aIn_bAl_{1-a-b}As_{1-c}Sb_c$, or $Ga_aIn_bAl_{1-a-b}As_{1-c}Sb_c/Ga_dIn_eAl_{1-d-e}As_{1-f}Sb_f$ superlattices, with $0 \leq a \leq 1$, $0 \leq b \leq 1$, $0 \leq c \leq 1$, $0 \leq d \leq 1$, $0 \leq e \leq 1$ and $0 \leq f \leq 1$.

The blocking region 3e, 3c can be formed with materials chosen from AlSb, AlGaSb, AlAsSb, GaAlAsSb, AlPSb or AlGaPSb for the second semiconductor material and more generally for the barrier materials. For the third semiconductor material and more generally for the well materials, it is possible to use the same materials as those mentioned for the second semiconductor material as well as the materials mentioned to form the first semiconductor material. In more particular manner, the third semiconductor material can be chosen from $Ga_aIn_bAl_{1-a-b}As_{1-c}Sb_c$, or $Ga_aIn_bAl_{1-a-b}As_{1-c}Sb_c/Ga_dIn_eAl_{1-d-e1-f}Sb_f$ superlattices, with $0 \leq a \leq 1$, $0 \leq b \leq 1$, $0 \leq c \leq 1$, $0 \leq d \leq 1$, $0 \leq e \leq 1$ and $0 \leq f \leq 1$.

The materials forming the contacts 2 can be chosen from InAs, InAsSb or InGaAs, or $InAs/In_{1-x}Al_xSb$ or InAs/InGaSb and GaSb superlattices. The materials of the contact regions can be primarily n-doped or p-doped. In more particular manner, the material of the contacts can be chosen from $Ga_aIn_bAl_{1-a-b}As_{1-c}Sb_c$, or $Ga_aIn_bAl_{1-a-b}Sb_c/Ga_dIn_eAl_{1-d-e}Sb_f$ superlattices, with $0 \leq a \leq 1$, $0 \leq b \leq 1$, $0 \leq c \leq 1$, $0 \leq d \leq 1$, $0 \leq e \leq 1$ and $0 \leq f \leq 1$.

Whereas in devices of the prior art, the blocking region is made from a single material, the use of a blocking region 3e, 3c with quantum wells enables parasitic currents to be reduced, thereby enabling the bias applied to make the photodetector operate to be reduced which is beneficial for its functionality and in particular its operability. Such a photodetector thereby enables the electric consumption to be reduced.

In the case where several photodetectors are integrated in a detection matrix, it is possible to reduce the electric consumption of the detection matrix by increasing the operating temperature, but it is above all possible to reduce the number of atypical pixels thereby enabling a better-quality image to be obtained.

In other words, such a photodetector enables operation at a higher temperature for an equivalent image quality (for the same noise level). The photodetector and detection matrix present a better operability and can operate over a larger temperature range.

By reducing the parasitic currents, it is possible to increase the operating temperature of the focal plane containing the photodetectors. This increase of the operating temperature enables the consumption of the cooling system to be reduced and/or the size of the cooling system to be reduced and/or the reliability of the detection device to be enhanced.

The invention claimed is:

1. Photodetector, comprising:
   a photon absorbing region formed by a first semiconductor material having a first bandgap energy value,
   a contact region made from semiconductor material,
   a blocking region formed by (i) at least one layer of a second semiconductor material and at least two layers of a third semiconductor material or (ii) at least two layers of a second semiconductor material and at least one layer of a third semiconductor material, the second semiconductor material being configured to oppose flow of majority charge carriers between the photon absorbing region and the contact region, the second semiconductor material presenting a second bandgap energy value higher than the first bandgap energy value, the third semiconductor material having a third bandgap energy value different from the second bandgap energy value,
   wherein the blocking region is doped and
   wherein the layers of second and third semiconductor materials form at least one quantum well in the blocking region.

2. Photodetector according to claim 1, wherein a thickness of the layers of second semiconductor material is at least twice that of a thickness of the layers of third semiconductor material.

3. Photodetector according to claim 1, wherein the blocking region is configured to be devoid of mini-bands.

4. Photodetector according to claim 1, wherein the blocking region comprises at least one layer of a fourth semiconductor material presenting a fourth bandgap energy value higher than the first bandgap energy value and different from the second bandgap energy value and from the third bandgap energy value.

5. Photodetector according to claim 1, including a substrate comprising the photon absorbing region, the blocking region, the contact region and a support region, and wherein the support region is separated from the contact region by the photon absorbing region and the blocking region.

6. Photodetector according to claim 5, further comprising:
an additional contact region and
an additional blocking region arranged between the photon absorbing region and the additional contact region, the additional blocking region being configured to block the minority charge carriers between the photon absorbing region and the additional contact region.

7. Photodetector according to claim 6, wherein the additional contact region is located between the support region and the photon absorbing region.

8. Photodetector according to claim 6, wherein the additional blocking region comprises layers of a fifth semiconductor material and layers of a sixth semiconductor material respectively presenting fifth and sixth bandgap energy values, the fifth and/or sixth bandgap energy value being higher than the first bandgap energy value, the layers of fifth and sixth semiconductor materials form at least one quantum well in the additional blocking region.

9. Photodetector according to claim 1, wherein the first semiconductor material is identical to the third semiconductor material and/or to the fifth semiconductor material.

10. Photodetector according to claim 1, wherein the blocking region and/or the additional blocking region are doped over their whole thickness.

11. Photodetector according to claim 1, wherein the blocking region defines one or more potential well regions and several potential barrier regions and wherein the blocking region is doped only in one or more of said potential well regions.

12. Photodetector according to claim 1, wherein the blocking region defines one or more potential well regions and several potential barrier regions and wherein the blocking region is doped only outside the potential well region or regions.

13. Photodetector according to claim 1, wherein the blocking region comprises an alternation of layers of second semiconductor material and of third semiconductor material and wherein the layers of second semiconductor material are tensile stressed and the layers of third semiconductor material are compressive stressed.

14. Photodetector according to claim 1, wherein the blocking region comprises between 1 and 10 quantum wells.

15. Photodetector according to claim 1, wherein the blocking region is in direct contact with the photon absorbing region.

16. Photodetector according to claim 1, wherein the blocking region is in direct contact with the contact region.

17. Photodetector according to claim 1, wherein the blocking region is formed by at least one layer of the second semiconductor material and at least two layers of the third semiconductor material.

18. Photodetector according to claim 1, wherein the blocking region is formed by at least two layers of the second semiconductor material and at least one layer of the third semiconductor material.

* * * * *